(12) United States Patent
Kim et al.

(10) Patent No.: US 9,230,936 B2
(45) Date of Patent: Jan. 5, 2016

(54) INTEGRATED DEVICE COMPRISING HIGH DENSITY INTERCONNECTS AND REDISTRIBUTION LAYERS

(71) Applicant: QUALCOMM Incorporated, San Diego, CA (US)

(72) Inventors: Dong Wook Kim, San Diego, CA (US); Hong Bok We, San Diego, CA (US); Jae Sik Lee, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/196,817

(22) Filed: Mar. 4, 2014

(65) Prior Publication Data

US 2015/0255416 A1 Sep. 10, 2015

(51) Int. Cl.
*H01L 21/00* (2006.01)
*H01L 23/00* (2006.01)
*H01L 23/31* (2006.01)

(52) U.S. Cl.
CPC ............ *H01L 24/25* (2013.01); *H01L 23/3107* (2013.01); *H01L 23/3157* (2013.01); *H01L 24/19* (2013.01); *H01L 2924/1815* (2013.01)

(58) Field of Classification Search
USPC ........... 438/597–688, 106–127; 257/678–796
See application file for complete search history.

(56) References Cited

U.S. PATENT DOCUMENTS

| 8,384,225 | B2 | 2/2013 | Rahman et al. | |
|---|---|---|---|---|
| 2008/0142946 | A1* | 6/2008 | Yang et al. | 257/690 |
| 2009/0140442 | A1* | 6/2009 | Lin | 257/778 |
| 2010/0142174 | A1* | 6/2010 | Pagaila et al. | 361/820 |
| 2010/0193959 | A1* | 8/2010 | Grygiel | 257/773 |
| 2010/0244208 | A1* | 9/2010 | Pagaila et al. | 257/659 |
| 2011/0186998 | A1 | 8/2011 | Wu et al. | |
| 2011/0316146 | A1 | 12/2011 | Pagaila et al. | |
| 2011/0316156 | A1 | 12/2011 | Pagaila et al. | |
| 2013/0127054 | A1 | 5/2013 | Muthukumar et al. | |
| 2013/0154092 | A1 | 6/2013 | Yang et al. | |
| 2013/0214410 | A1 | 8/2013 | Khan et al. | |

OTHER PUBLICATIONS

International Search Report and Written Opinion—PCT/US2015/018784—ISA/EPO—Aug. 21, 2015.

* cited by examiner

*Primary Examiner* — Karen Kusumakar
(74) *Attorney, Agent, or Firm* — Loza & Loza, LLP

(57) ABSTRACT

Some novel features pertain to an integrated device (e.g., integrated package) that includes a base portion for the integrated device, a first die coupled to a first surface of the base portion, and an underfill between the first die and the base portion. The base portion includes a dielectric layer, and a set of redistribution metal layers. In some implementations, the integrated device further includes an encapsulation material that encapsulates the first die. In some implementations, the integrated device further includes a second die coupled to the first surface of the base portion. In some implementations, the integrated device further includes a set of interconnects on the base portion, the set of interconnects electrically coupling the first die and the second die. In some implementations, the first die includes a first set of interconnect pillars and the second die includes a second set of interconnect pillars.

24 Claims, 18 Drawing Sheets

INTEGRATED DEVICE COMPRISING HIGH DENSITY INTERCONNECTS AND
REDISTRIBUTION LAYERS

BACKGROUND

1. Field

Various features relate to an integrated device that includes high density interconnects and redistributions layers.

2. Background

FIG. 1 illustrates a conventional integrated package 100 that includes a substrate 102, a first die 106, a second die 108, a first set of solder balls 116, a second set of solder balls 118, and a third set of solder balls 120. The first die 106 is coupled to the substrate 102 through the first set of solder balls 116. The second die 108 is coupled to the substrate 102 through the second set of solder balls 118. The third set of solder balls 120 is coupled to the substrate 102. Typically, the third set of solder balls 120 is coupled to a printed circuit board (PCB) (not shown).

Conventional integrated packages, such as the one described in FIG. 1, have certain limitations and downsides. For example, the substrate 102 of the integrated package 100 of FIG. 1 is typically made of an organic laminate (e.g., rigid or flexible), or a silicon (Si) interposer. The use of such materials as a substrate creates design problems when attempting to manufacture low profile integrated package. That is, these materials create substantial design penalty due to their manufacturing limitations. In particular, these materials make it impossible or cost-prohibitive to provide a low profile integrated package.

Moreover, the use of solder balls as a coupling method between a die and a substrate limits the density of the connection that can exist between a die and a substrate, as the minimum spacing required between solder balls is often greater than the minimum spacing required between traces and/or vias on a substrate.

In addition, during the manufacturing process of an integrated device, tool alignment tolerances and the shifting of dies can cause inaccuracy in the placement of dies on a substrate. To account for these issues, big landing pads must be provided to ensure that there is proper connection of the dies. These big landing pads can take up valuable space in the integrated device and add unnecessary cost to the manufacturing of an integrated device.

Therefore, there is a need for a cost effective integrated package that has a low profile but also takes up a little real estate as possible. Ideally, such an integrated package will also provide higher density connections with the dies.

SUMMARY

Various features, apparatus and methods described herein provide an integrated device that includes high density interconnects redistributions layers.

A first example provides an integrated device that includes a base portion for the integrated device, a first die coupled to a first surface of the base portion, and an underfill between the first die and the base portion. The base portion includes a dielectric layer, and a set of redistribution metal layers.

According to an aspect, the integrated device further includes an encapsulation material that encapsulates the first die.

According to one aspect, the integrated device further includes a second die coupled to the first surface of the base portion. In some implementations, the integrated device further includes a set of interconnects on the base portion, the set of interconnects electrically coupling the first die and the second die. In some implementations, the first die includes a first set of interconnect pillars and the second die includes a second set of interconnect pillars. The set of interconnects is coupled to the first set of interconnects pillars and the second set of interconnect pillars while bypassing a bump pad and/or landing pad. In some implementations, the set of interconnects has a first pitch that is about 40 microns (μm) or less. In some implementations, the underfill is also between the second die and the base portion.

According to an aspect, the first die is a first wafer level die.

According to an aspect, the first die includes a first set of interconnect pillars, the first die is coupled to the set of redistribution metal layers through the first set of interconnect pillars. In some implementations, the first set of interconnect pillars has a first pitch that is about 40 microns (μm) or less.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a base portion for the integrated device. The base portion includes a dielectric layer, and a redistribution means. The apparatus further includes a first die coupled to a first surface of the base portion, a means for encapsulating an area between the first die and the base portion.

According to an aspect, the apparatus further includes an encapsulation means that encapsulates the first die.

According to one aspect, the apparatus further includes a second die coupled to the first surface of the base portion. In some implementations, the apparatus further includes a set of interconnects on the base portion. The set of interconnects electrically couples the first die and the second die. In some implementations, the first die includes a first set of interconnect pillars. The second die includes a second set of interconnect pillars. The set of interconnects is coupled to the first set of interconnects pillars and the second set of interconnect pillars while bypassing a landing pad. In some implementations, the set of interconnects includes a first pitch that is about 40 microns (μm) or less.

According to an aspect, the first die is a first wafer level die.

According to one aspect, the first die includes a first set of interconnect pillars. The first die is coupled to the redistribution means through the first set of interconnect pillars.

According to an aspect, the first set of interconnect pillars includes a first pitch that is about 40 microns (μm) or less.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an integrated device. The method forms a base portion for the integrated device, where forming the base portion includes forming a dielectric layer, and forming a set of redistribution metal layers. The method provides a first die on a first surface of the base portion. The method forms an underfill between the first die and the base portion.

According to an aspect, the method further forms an encapsulation material that encapsulates the first die.

According to one aspect, the method provides a second die on the first surface of the base portion. In some implementations, the method forms a set of interconnects on the base portion. The set of interconnects electrically coupling the first die and the second die. In some implementations, the first die includes a first set of interconnect pillars and the second die includes a second set of interconnect pillars. The set of interconnects is coupled to the first set of interconnects pillars and the second set of interconnect pillars while bypassing a landing pad. In some implementations, the set of interconnects includes a first pitch that is about 40 microns (µm) or less.

According to an aspect, the first die is a first wafer level die.

According to one aspect, the first die includes a first set of interconnect pillars. The first die is coupled to the set of redistribution metal layers through the first set of interconnect pillars. In some implementations, the first set of interconnect pillars includes a first pitch that is about 40 microns (µm) or less.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., integrated package) that includes a base portion for the integrated device, a first die (e.g., first wafer level die) coupled to a first surface of the base portion, and an underfill between the first die and the base portion. The base portion includes a dielectric layer, and a set of redistribution metal layers. In some implementations, the integrated device further includes an encapsulation material that encapsulates the first die. In some implementations, the integrated device further includes a second die (e.g., second wafer level die) coupled to the first surface of the base portion. In some implementations, the integrated device further includes a set of interconnects on the base portion, the set of interconnects electrically coupling the first die and the second die. In some implementations, the first die includes a first set of interconnect pillars and the second die includes a second set of interconnect pillars. The set of interconnects is coupled to the first set of interconnects pillars and the second set of interconnect pillars while bypassing a landing pad (e.g., bump pad). In some implementations, the set of interconnects has a first pitch of about 40 microns (µm) or less. In some implementations, the underfill is also between the second die and the base portion.

Exemplary Integrated Device that Includes Redistribution Layers

Figure 1:
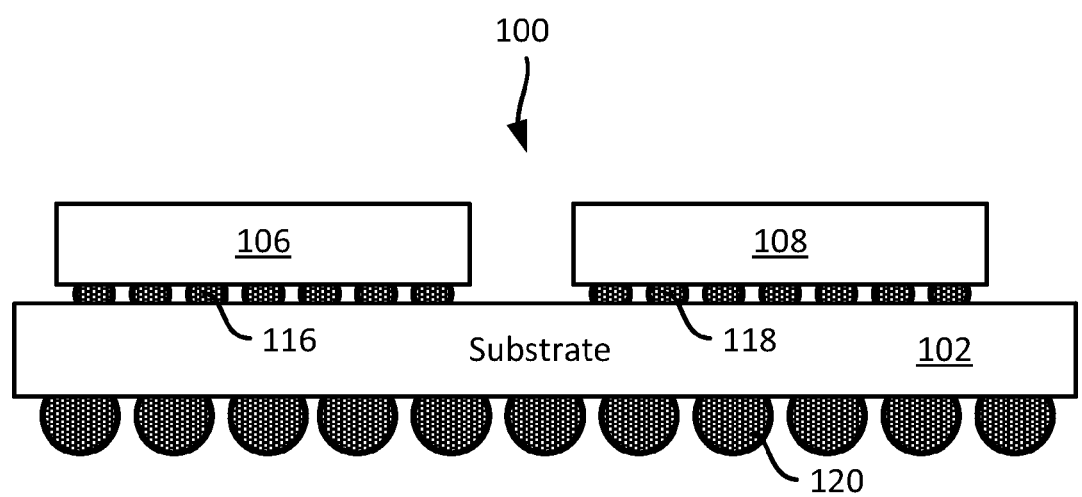
FIG. 1 illustrates a profile view of a conventional integrated device.
Figure 2:
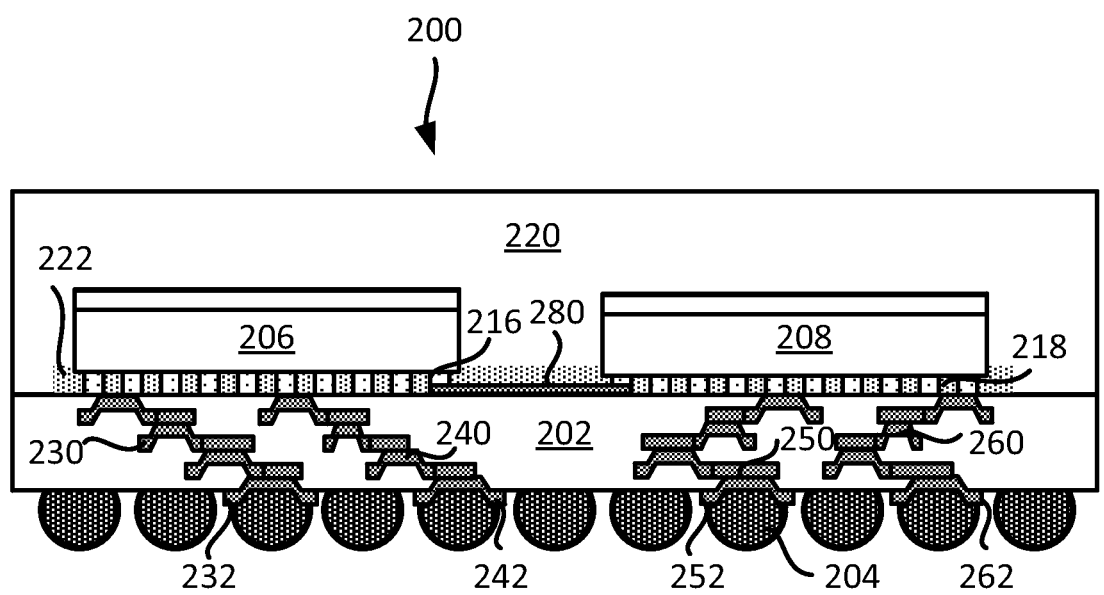
FIG. 2 illustrates an example of an integrated device.

FIG. 2 conceptually illustrates an example of a side view of an integrated device (e.g., semiconductor device, integrated package) that includes several dies. Specifically, FIG. 2 illustrates an integrated device 200 (e.g., integrated package) that includes a dielectric layer 202, a first set of solder balls 204, a first die 206, a second die 208, an encapsulation material 220, and an underfill 222. Different implementations may use different materials for the encapsulation material 220. For example, the encapsulation material 220 may include one of at least a mold, an epoxy and/or a polymer fill. The dies (e.g., first die 206, second die 208) may represent different types of dies, such as memory dies, and/or processors. In some implementations, the first die 206 and/or the second die 208 are wafer level dies. Dies are further described in detail below with reference to FIGS. 3-4.

The dielectric layer 202 may include one dielectric layer or several dielectric layers. In some implementations, the dielectric layer 202 is an insulation layer. FIG. 2 illustrates that the dielectric layer 202 includes a set of metal layers. In particular, the dielectric layer 202 includes a first set of redistribution interconnects 230, a first under bump (UBM) layer 232, a second set of redistribution interconnects 240, a second under bump (UBM) layer 242, a third set of redistribution interconnects 250, a third under bump (UBM) layer 252, a fourth set of redistribution interconnects 260, a fourth under bump (UBM) layer 262, and a fifth set of redistribution interconnects 280. In some implementations, the first, second, third, and fourth redistribution interconnects 230, 240, 250, and 260 are redistribution layers in the dielectric layer 202. The redistribution layers may include vias. Different implementations may have different number of redistribution metal layers (e.g., 1, 2 or more metal layers).

The fifth set of redistribution interconnects 280 is a metal layer on the dielectric layer 202 (e.g., on surface of dielectric layer 202). In some implementations, the first, second, third, and fourth redistribution interconnects 230, 240, 250, and 260 have respectively, a first pitch, a second pitch, a third pitch, and a fourth pitch. In some implementations, the fifth set of redistribution interconnects 280 has a fifth pitch that is different than the first pitch, the second pitch, the third pitch, and/or the fourth pitch. In some implementations, the fifth pitch is less than the first pitch, the second pitch, the third pitch, and/or the fourth pitch. The fifth set of redistribution interconnects 280 is coupled to the first set of interconnects 216 and the second set of interconnects 218. In some implementations, the fifth set of redistribution interconnects 280 includes a set of high density interconnects. In some implementations, the fifth set of interconnects 280 includes a first pitch that is about 40 microns (μm) or less.

The first die 206 is coupled to a first surface of the dielectric layer 202 through the first set of interconnects 216. In some implementations, the first set of interconnects 216 are metal pillars (e.g., metal layers). In some implementations, the metal pillars are copper pillars. In some implementations, the first die 206 is electrically coupled to at least one of the set of solder balls 204 through the first set of interconnects 216, the first set of redistribution interconnects 230, the first UBM layer 232, the second set of redistribution interconnects 240, and/or the second UBM layer 242.

The second die 208 is coupled to the first surface of the dielectric layer 202 through the second set of interconnects 218. In some implementations, the second set of interconnects 218 are metal pillars (e.g., metal layers). In some implementations, the metal pillars are copper pillars. In some implementations, the second die 208 is electrically coupled to at least one of the set of solder balls 204 through the second set of interconnects 218, the third set of redistribution interconnects 250, and/or the third UBM layer 252.

As shown in FIG. 2, the first die 206 may be electrically coupled to the second die 208 through the fifth set of redistribution interconnects 280. FIG. 2 also illustrates that the first set of interconnects 216 and the second set of interconnects 218 are encapsulated by the underfill 222. The underfill 222 is optional in some instances.

Figure 3:
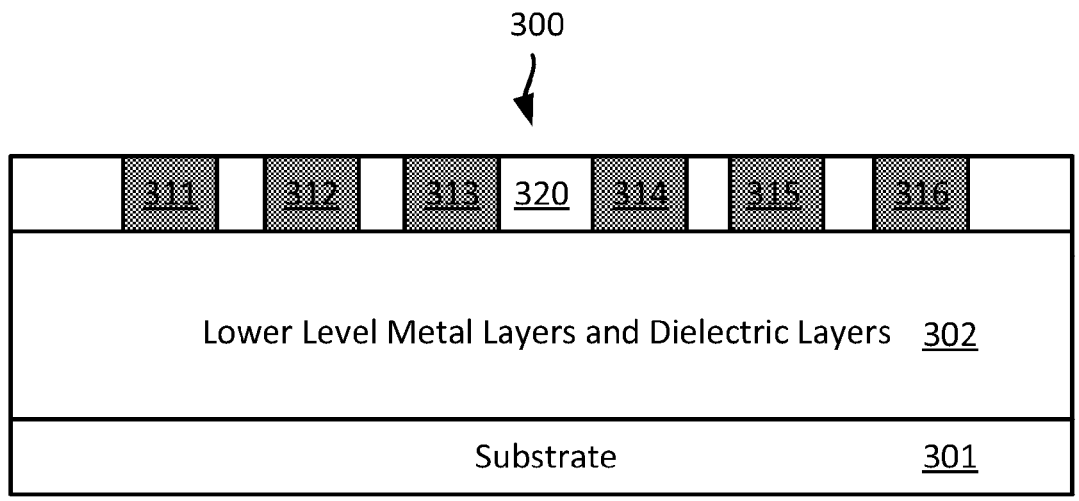
FIG. 3 illustrates an example of a die.

FIG. 3 conceptually illustrates an example of a die 300 (which is a form of an integrated device). For purpose of clarity, FIG. 3 illustrates a generalization of a die. As such, not all the components of a die are shown in FIG. 3. In some implementations, the die 300 may correspond to at least one of the dies 206, and/or 208 of FIG. 2. As shown in FIG. 3, the die 300 (e.g., integrated device) includes a substrate 301, several lower level metal layers and dielectric layers 302, a set of interconnects 311-316 (e.g., bumps, pillar interconnects), and an encapsulation material 320 (e.g., mold, epoxy, polymer fill). In some implementations, the encapsulation material 320 may be optional.

The die 300 includes a front side region (e.g., active region) and a back side region. In some implementations, the die 300 is wafer level die.

In some implementations, the die 300 may also include pads, a passivation layer, a first insulation layer, a first under bump metallization (UBM) layer, and a second under bump metallization (UBM) layer. In such instances, the pad may be coupled to the lower level metal layers and dielectric layers 302. A passivation layer may be positioned between the lower level metal layers and dielectric layers 302 and the encapsulation material 320. A first bump layer may be coupled to the pad and one of the interconnects 311-316.

Figure 4:
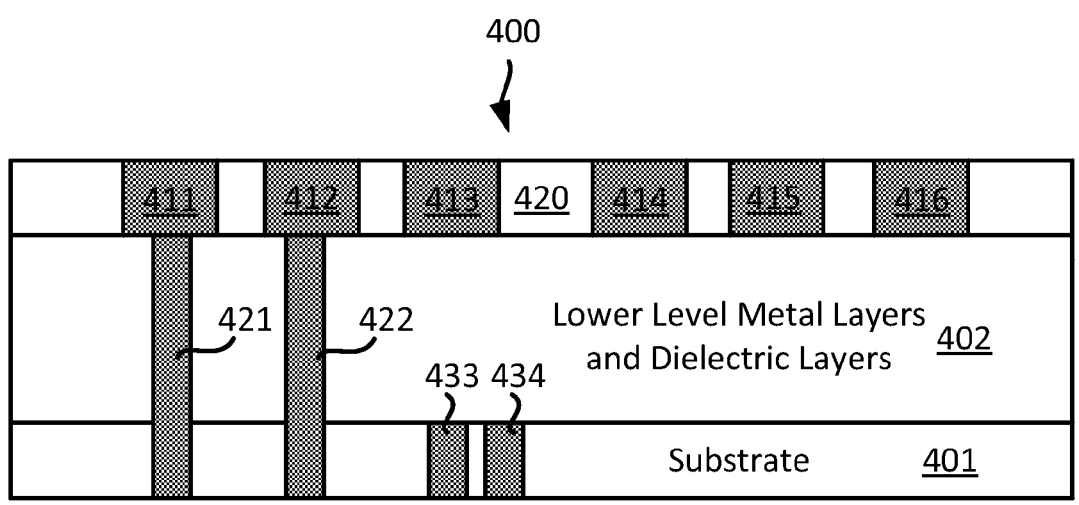
FIG. 4 illustrates an example of a die that includes a through substrate via.

In some implementations, a die may also include one or more through substrate vias (TSVs). FIG. 4 conceptually illustrates an example of a die 400 (which is a form of an integrated device) that includes at least one TSV. For purpose of clarity, FIG. 4 illustrates a generalization of a die. As such, not all the components of a die are shown in FIG. 4. In some implementations, the die 400 may correspond to at least one of the dies 206, and/or 208 of FIG. 2. As shown in FIG. 4, the die 400 (e.g., integrated device) includes a substrate 401, several lower level metal layers and dielectric layers 402, a set of interconnects 411-416 (e.g., bumps, pillar interconnects), and an encapsulation material 420 (e.g., mold, epoxy, polymer fill). In some implementations, the encapsulation material 420 may be optional.

The die 400 includes a front side region (e.g., active region) and a back side region. In some implementations, the die 400 is a wafer level die.

As shown in FIG. 4, the die 400 includes a first through substrate via (TSV) 421, a second TSV 422, a third TSV 423, and a fourth TSV 424. The first TSV 421 and the second TSV 422 traverse the substrate 401 and the lower level metal layers and dielectric layers 402. That is, the first TSV 421 and the second TSV 422 traverse the active region (e.g., front side) and the back side region of the die 400. The third TSV 433 and the fourth TSV 434 traverse the substrate 401. That is, the third TSV 433 and the fourth TSV 434 traverse the active region (e.g., front side) of the die 400.

In some implementations, the die 400 may also include pads, a passivation layer, a first insulation layer, a first under bump metallization (UBM) layer, and a second under bump metallization (UBM) layer. In such instances, the pad may be coupled to the lower level metal layers and dielectric layers 402. A passivation layer may be positioned between the lower level metal layers and dielectric layers 402 and the encapsulation material 420. A first bump layer may be coupled to the pad and one of the interconnects 411-416.

Figure 5:
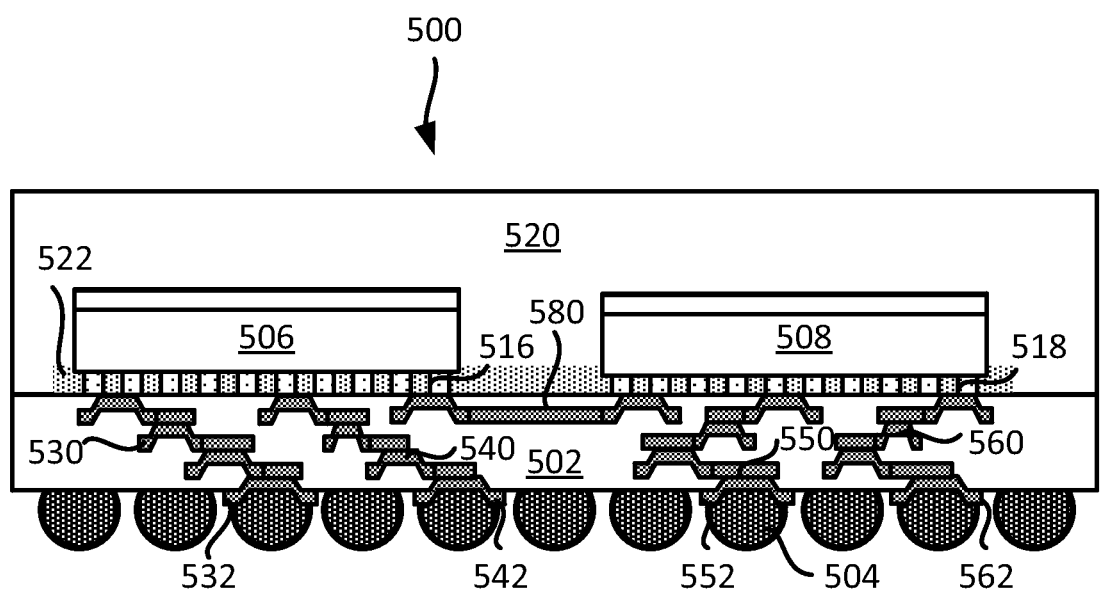
FIG. 5 illustrates an example of an integrated device.

FIG. 5 conceptually illustrates an example of a side view of an integrated device (e.g., semiconductor device, integrated package) that includes several dies. Specifically, FIG. 5 illustrates a integrated device 500 (e.g., integrated package) that includes a dielectric layer 502, a first set of solder balls 504, a first die 506, a second die 508, an encapsulation material 520, and an underfill 522. Different implementations may use different materials for the encapsulation material 520. For example, the encapsulation material 520 may include one of at least a mold, an epoxy and/or a polymer fill. The dies (e.g., first die 506, second die 508) may represent different types of dies, such as memory dies, and/or processors. In some implementations, the first die 506 and/or the second die 508 are wafer level dies. Dies are described in detail with reference to FIGS. 3-4.

The dielectric layer 502 may include one dielectric layer or several dielectric layers. In some implementations, the dielectric layer 502 is an insulation layer. FIG. 5 illustrates that the dielectric layer 502 includes a set of metal layers. In particular, the dielectric layer 502 includes a first set of redistribution interconnects 530, a first under bump (UBM) layer 532, a second set of redistribution interconnects 540, a second under bump (UBM) layer 542, a third set of redistribution interconnects 550, a third under bump (UBM) layer 552, a fourth set of redistribution interconnects 560, a fourth under bump (UBM) layer 562, and a fifth set of redistribution interconnects 580. In some implementations, the first, second, third, and fourth redistribution interconnects 530, 540, 550, 560, and 580 are redistribution layers. The redistribution layers may include vias. Different implementations may have different number of redistribution metal layers (e.g., 1, 5 or more metal layers).

The first die 506 is coupled to a first surface of the dielectric layer 502 through a first set of interconnects 516. In some implementations, the first set of interconnects 516 are metal pillars (e.g., metal layers). In some implementations, the metal pillars are copper pillars. In some implementations, the first die 506 is electrically coupled to at least one of the set of solder balls 504 through the first set of interconnects 516, the first set of redistribution interconnects 530, the first UBM layer 532, the second set of redistribution interconnects 540, and/or the second UBM layer 542.

The second die 508 is coupled to the first surface of the dielectric layer 502 through a second set of interconnects 518. In some implementations, the second set of interconnects 518 are metal pillars (e.g., metal layers). In some implementations, the metal pillars are copper pillars. In some implementations, the second die 508 is electrically coupled to at least one of the set of solder balls 504 through the second set of interconnects 518, the third set of redistribution interconnects 550, and/or the third UBM layer 552.

As shown in FIG. 5, the first die 506 may be electrically coupled to the second die 508 through the fifth set of redistribution interconnects 580. FIG. 5 also illustrates that the first set of interconnects 516 and the second set of interconnects 518 is encapsulated by the underfill 522. The underfill 522 is optional in some instances.

Figure 6:
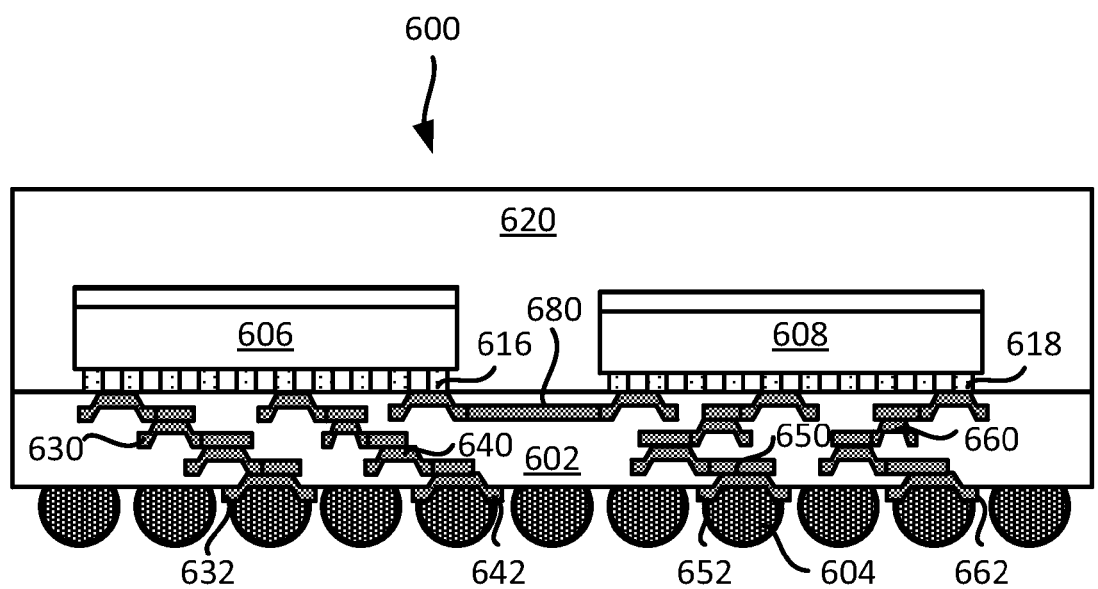
FIG. 6 illustrates an example of an integrated device.

FIG. 6 conceptually illustrates an example of a side view of an integrated device (e.g., semiconductor device, integrated package) that includes several dies. Specifically, FIG. 6 illustrates a integrated device 600 (e.g., integrated package) that includes a dielectric layer 602, a first set of solder balls 604, a first die 606, a second die 608, and an encapsulation material 620. Different implementations may use different materials for the encapsulation material 620. For example, the encapsulation material 620 may include one of at least a mold, an epoxy and/or a polymer fill. The dies (e.g., first die 606, second die 608) may represent different types of dies, such as memory dies, and/or processors. In some implementations, the first die 606 and/or the second die 608 are wafer level dies. Dies are described in detail with reference to FIGS. 3-4.

The dielectric layer 602 may include one dielectric layer or several dielectric layers. In some implementations, the dielectric layer 602 is an insulation layer. FIG. 6 illustrates that the dielectric layer 602 includes a set of metal layers. In particular, the dielectric layer 602 includes a first set of redistribution interconnects 630, a first under bump (UBM) layer 632, a second set of redistribution interconnects 640, a second under bump (UBM) layer 642, a third set of redistribution interconnects 650, a third under bump (UBM) layer 652, a fourth set of redistribution interconnects 660, a fourth under bump (UBM) layer 662, and a fifth set of redistribution interconnects 680. In some implementations, the first, second, third, and fourth redistribution interconnects 630, 640, 650, and 660 are redistribution layers. The redistribution layers may include vias. Different implementations may have different number of redistribution metal layers (e.g., 1, 6 or more metal layers).

The first die 606 is coupled to a first surface of the dielectric layer 602 through a first set of interconnects 616. In some implementations, the first set of interconnects 616 are metal pillars (e.g., metal layers). In some implementations, the metal pillars are copper pillars. In some implementations, the first die 606 is electrically coupled to at least one of the set of solder balls 604 through the first set of interconnects 616, the first set of redistribution interconnects 630, the first UBM layer 632, the second set of redistribution interconnects 640, and/or the second UBM layer 642.

The second die 608 is coupled to the first surface of the dielectric layer 602 through a second set of interconnects 618. In some implementations, the second set of interconnects 618 are metal pillars (e.g., metal layers). In some implementations, the metal pillars are copper pillars. In some implementations, the second die 608 is electrically coupled to at least one of the set of solder balls 604 through the second set of interconnects 618, the third set of redistribution interconnects 650, and/or the third UBM layer 652.

As shown in FIG. 6, the first die 606 may be electrically coupled to the second die 608 through the fifth set of redistribution interconnects 680.

Having described several integrated devices, a sequence for providing/manufacturing an integrated device (e.g., semiconductor device) will now be described below.

Exemplary Sequence for Providing/Manufacturing an Integrated Device that Includes a Redistribution Layer In some implementations, providing an integrated device (e.g., integrated package) that includes redistribution layers includes several processes. FIGS. 7A-7D illustrate an exemplary sequence for providing an integrated device. In some implementations, the sequence of FIGS. 7A-7D may be used to provide/manufacture the integrated device of FIGS. 2 and/or 5-6, and/or other integrated devices described in the present disclose.

It should also be noted that the sequence of FIGS. 7A-7D may be used to provide/manufacture integrated devices that also include circuit elements. It should further be noted that the sequence of FIGS. 7A-7D may combine one or more stages in order to simplify and/or clarify the sequence for providing an integrated device that includes several dies.

In some implementations, the process of FIGS. 7A-7D illustrates a novel process that provides an integrated device with high density interconnects (e.g., pitch between interconnects is about 40 microns or less) and/or an integrated device that bypasses the use of unnecessary big landing pads (e.g., big bump pads).

Figure 7A:
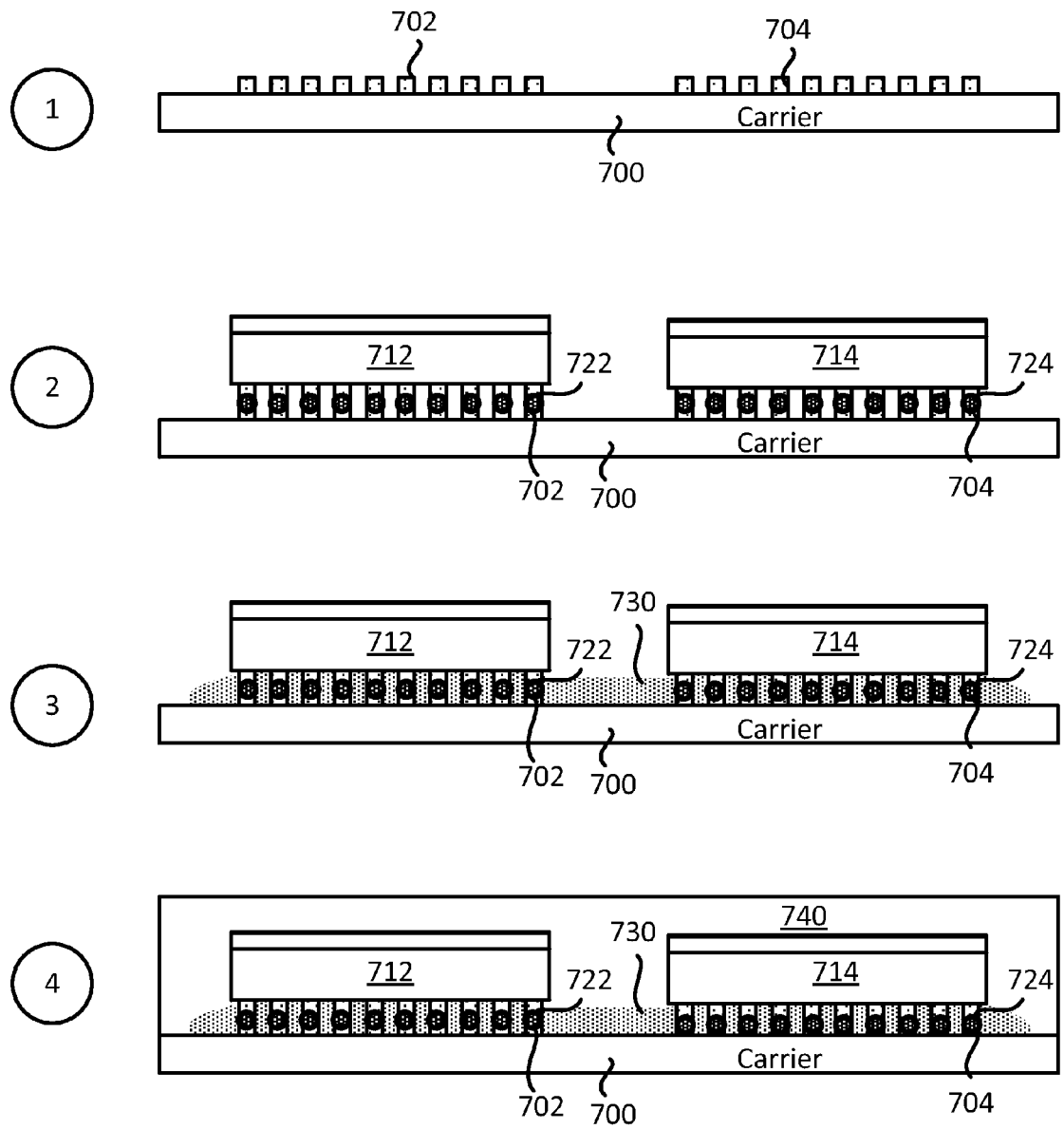
FIG. 7A illustrates part of an exemplary sequence for providing/manufacturing an integrated device.

As shown in stage 1 of FIG. 7A, a carrier (e.g., carrier 700), a first set of interconnects 702 (e.g., first set of traces) and a second set of interconnects 704 (e.g., second set of traces) are provided. In some implementations, the carrier is a substrate. Different implementations may use different materials for the carrier (e.g., silicon substrate, glass substrate, ceramic substrate).

At stage 2, several dies are provided on the carrier. As shown in stage 2, a first die 712 and a second die 714 are provided on the carrier 700. Specifically, the front sides (active sides) of the first die 712 and the second die 714 are coupled to the carrier 700. Examples of dies are described in FIGS. 3-4. The first die 712 includes a first set of interconnects 722 (e.g., bumps, copper pillar). The second die 714 includes a second set of interconnects 724 (e.g., bumps, copper pillar). As shown at stage 2, the first set of interconnects 722 of the first die 712 is coupled to the first set of interconnects 702 of the carrier 700. Similarly, the second set of interconnects 724 of the second die 714 is coupled to the second set of interconnects 704 of the carrier 700. In some implementations, the first die 712 and/or the second die 714 are wafer level dies.

At stage 3, an underfill 730 is provided on the carrier 700. In some implementations, the underfill 730 is provided such that the underfill 730 covers the first set of interconnects 702, the second set of interconnects 704, the first set of interconnects 722, and the second set of interconnects 724. In some implementations, providing the underfill 730 is optional.

At stage 4, an encapsulation material 740 is provided. The encapsulation material 740 substantially or completely surrounds or encapsulates the first die 712 and the second die 714.

Figure 7B:
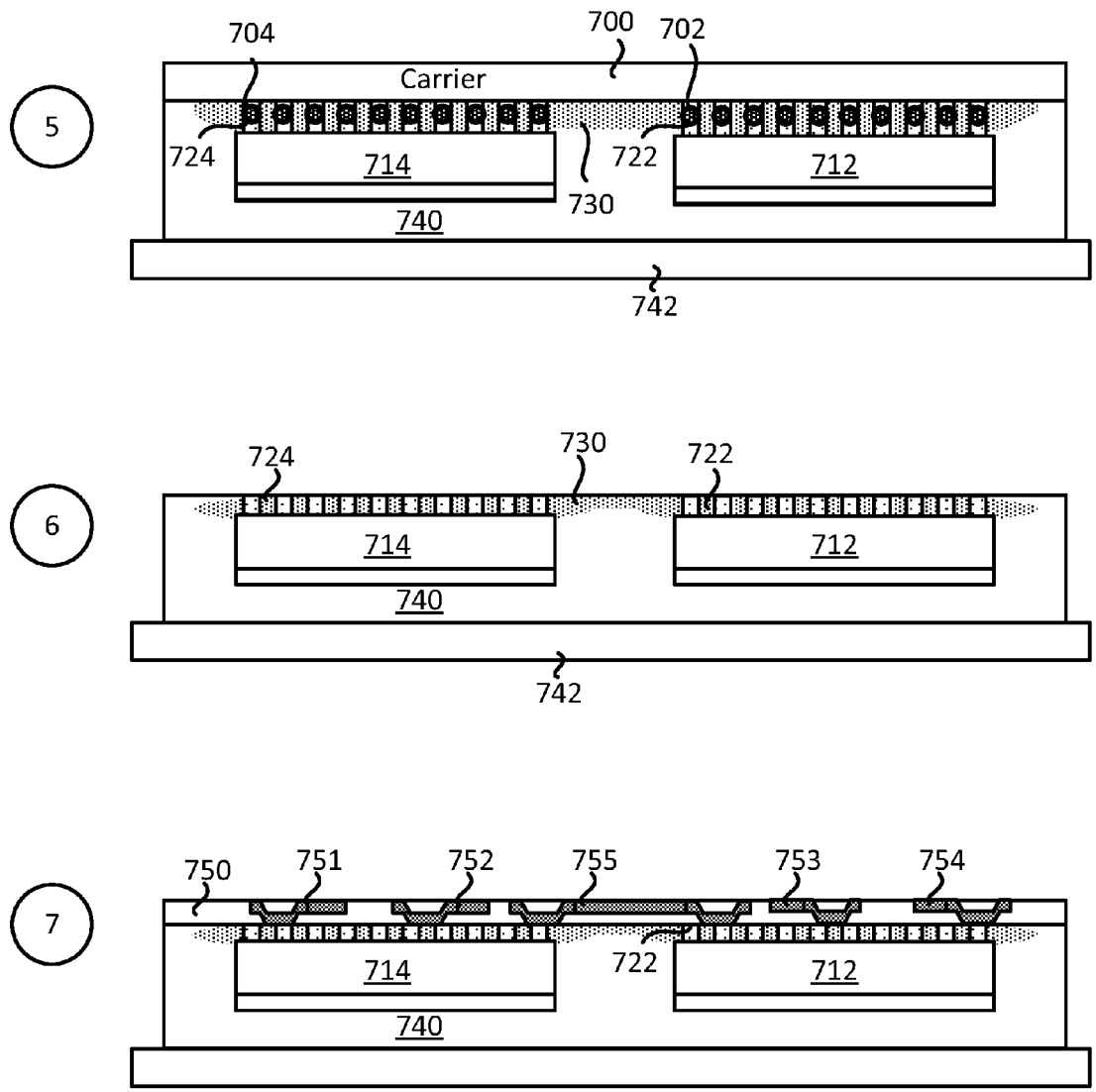
FIG. 7B illustrates part of an exemplary sequence for providing/manufacturing an integrated device.

At stage 5, as shown in FIG. 7B, the integrated device is flipped and coupled to a temporary carrier 742. That is, the encapsulation material 740 is coupled to the temporary carrier 742. Different implementations may use different materials (e.g., substrate, silicon, glass, ceramic) for the carrier 742. In some implementations, an adhesive layer (not shown) may be used to couple the encapsulation material 740 of the integrated device to the temporary carrier 742. Different implementations may use different materials for the adhesion layer. In some implementations, the temporary carrier 742 is a bonding tape.

At stage 6, a first surface of the integrated device is removed (e.g., polished, grinded). In this example, the surface that includes the carrier 700 is removed (e.g., polished, grinded). In some implementations, polishing the integrated device may include polishing and/or grinding the carrier 700, the first set of interconnects 702, the second set of interconnects 704, the first set of interconnects 712, the second set of interconnects 714, the underfill 730, and/or the encapsulation material 740. In some implementations, polishing the integrated device may leave behind portions of the first set of interconnects 702, the second set of interconnects 704, the first set of interconnects 712, the second set of interconnects 714, the underfill 730, and/or the encapsulation material 740.

At stage 7, a first dielectric layer 750 and several redistribution interconnects (e.g., redistribution interconnects 751-755) are provided on the front side of the first die 712 and the second die 714. Specifically, several interconnects are provided on the first set of interconnect 722 and the second set of interconnects 724. In some implementations, the redistribution interconnects 751-755 are formed on a first redistribution metal layer. In some implementations, the redistribution interconnects 755-755 may include at least one via. In some implementations, the redistribution interconnects 751-755 bypasses the use of unnecessary landing pads (e.g., big bump pads) when coupling to the first set of interconnect 722 and/or the second set of interconnects 724. In some implementations, the redistribution interconnects 751-755 are directly coupled to the first set of interconnect 722 and/or the second set of interconnects 724.

Figure 7C:
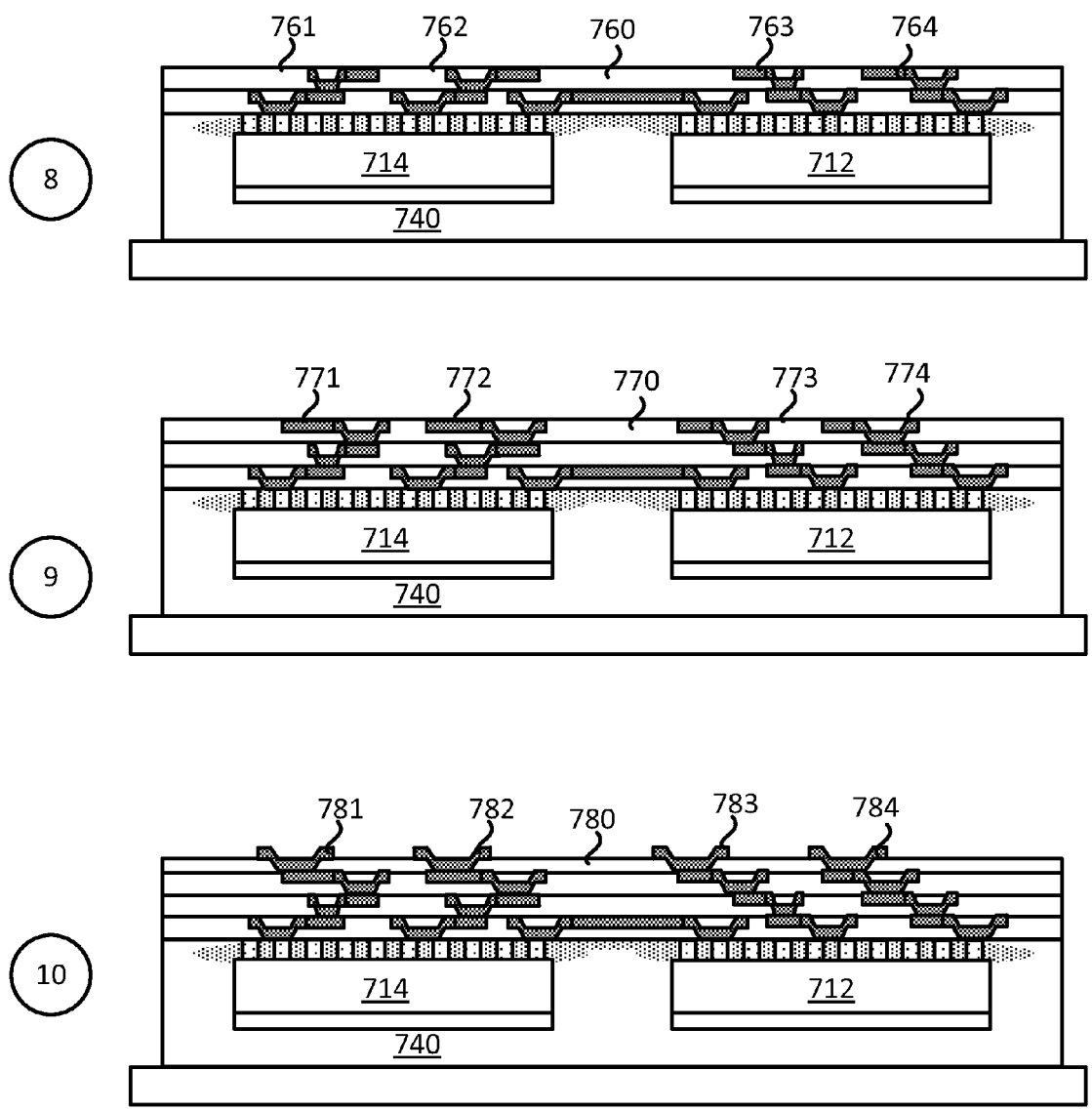
FIG. 7C illustrates part of an exemplary sequence for providing/manufacturing an integrated device.

At stage 8, as shown in FIG. 7C, a second dielectric layer 760 and several redistribution interconnects (e.g., redistribution interconnects 761-764) are provided on the first dielectric layer 750 and the redistribution interconnects 751-754. In some implementations, the redistribution interconnects 761-764 are formed on a second redistribution metal layer. In some implementations, the redistribution interconnects 761-764 may include at least one via.

At stage 9, a third dielectric layer 770 and several redistribution interconnects (e.g., redistribution interconnects 771-774) are provided on the second dielectric layer 760 and the redistribution interconnects 761-764. In some implementations, the redistribution interconnects 771-774 is formed on a third redistribution metal layer. In some implementations, the redistribution interconnects 771-774 may include at least one via.

At stage 10, at least one under bump metallization (UBM) layer is provided. Specifically, a first under bump metallization (UBM) layer 781, a second UBM layer 782, a third UBM layer 783, and a fourth UBM layer 784 are provided. The UBM layers are provided on the fourth dielectric layer 780. In some implementations, providing the UBM layer is optional.

Figure 7D:
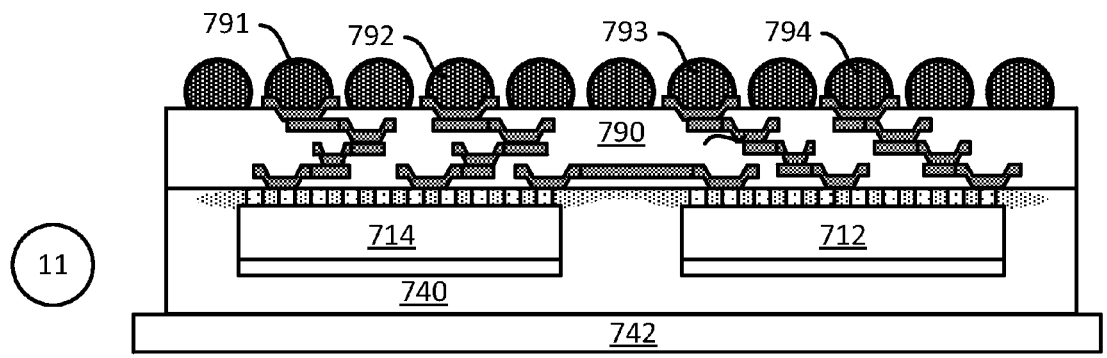
FIG. 7D illustrates part of an exemplary sequence for providing/manufacturing an integrated device.
Figure 7D:
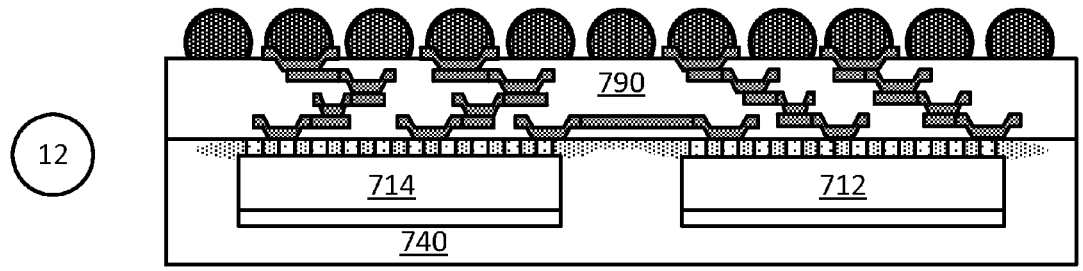

At stage 11, as shown in FIG. 7D, at least one solder ball is provided on the UBM layer. Specifically, a first solder ball 791 is coupled to the first UBM layer 781, a second solder ball 792 is coupled to the second UBM layer 782, a third solder ball 793 is coupled to the third UBM layer 783, and a fourth solder ball 794 is coupled to the fourth UBM layer 784. Stage 11 illustrates the set of dielectric layers 790. In some implementations, the set of dielectric layers 790 includes the dielectric layers 750, 760, 770 and 780. In some implementations, the solder ball may be coupled to the redistribution interconnects instead of a UBM layer.

At stage 12, a portion of the integrated device is removed (e.g., polished). As shown at stage 12, at least a portion of the carrier 742 is removed (e.g., entire carrier 742 is removed). In some implementations, at least a portion of the encapsulation material 740 is also removed.

Exemplary Sequence for Providing/Manufacturing an Integrated Device that Includes a Redistribution Layer In some implementations, providing an integrated device (e.g., integrated package) that includes redistribution layers includes several processes. FIGS. 8A-8D illustrate an exemplary sequence for providing an integrated device. In some implementations, the sequence of FIGS. 8A-8D may be used to provide/manufacture the integrated device of FIGS. 2 and/or 5-6, and/or other integrated devices described in the present disclose.

It should also be noted that the sequence of FIGS. 8A-8D may be used to provide/manufacture integrated devices that also include circuit elements. It should further be noted that the sequence of FIGS. 8A-8D may combine one or more stages in order to simplify and/or clarify the sequence for providing an integrated device that includes several dies.

In some implementations, the process of FIGS. 8A-8D illustrates a novel process that provides an integrated device with high density interconnects (e.g., pitch between interconnects is about 40 microns or less) and/or an integrated device that bypasses the use of unnecessary big landing pads (e.g., big bump pads).

Figure 8A:
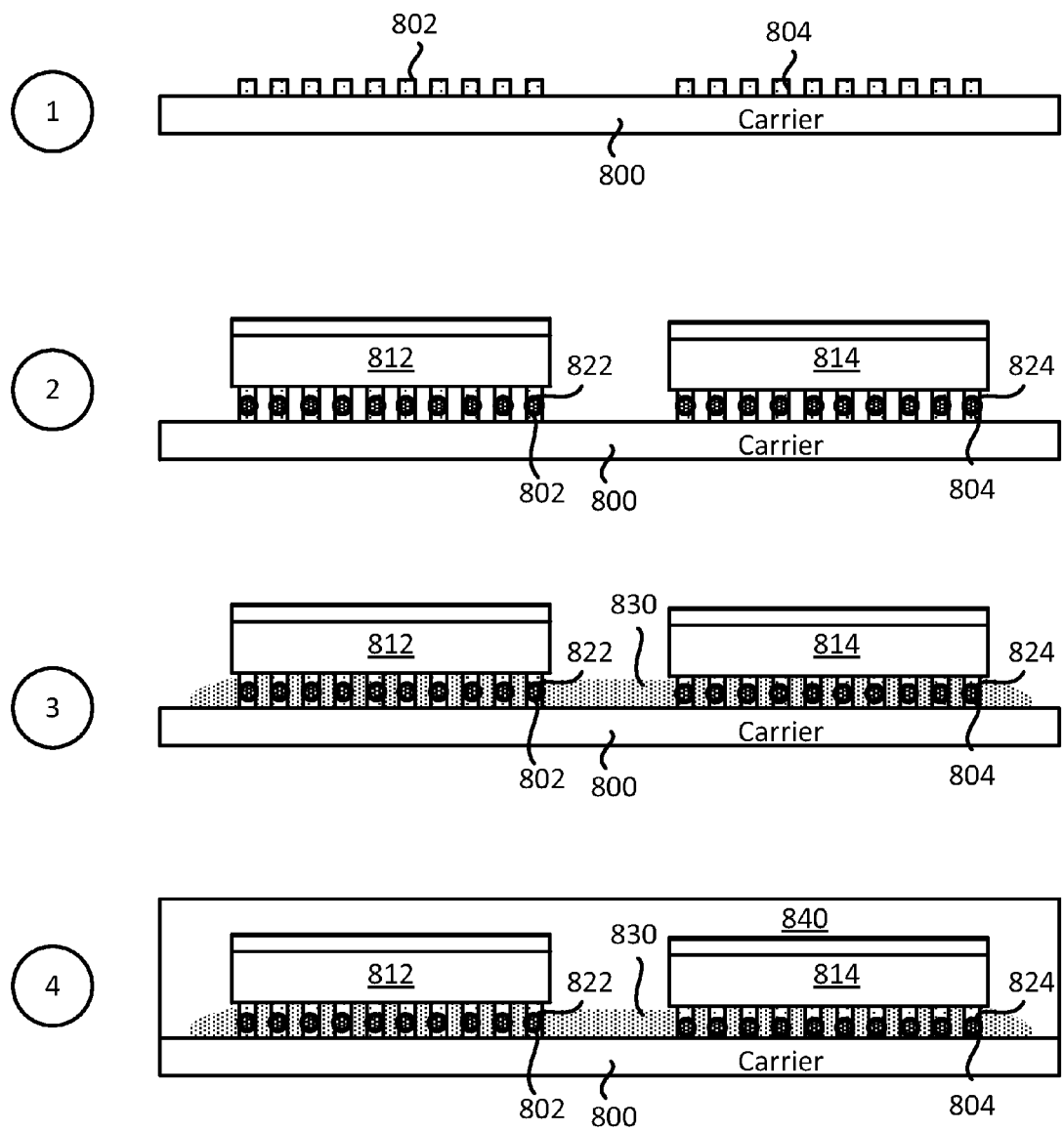
FIG. 8A illustrates part of an exemplary sequence for providing/manufacturing an integrated device.

As shown in stage 1 of FIG. 8A, a carrier (e.g., carrier 800), a first set of interconnects 802 (e.g., first set of traces) and a second set of interconnects 804 (e.g., second set of traces) are provided. In some implementations, the carrier is a substrate. Different implementations may use different materials for the carrier (e.g., silicon substrate, glass substrate, ceramic substrate).

At stage 2, several dies are provided on the carrier. As shown in stage 2, a first die 812 and a second die 814 are provided on the carrier 800. Specifically, the front side (active side) of the first die 812 and the second die 814 are coupled to the carrier 800. Examples of dies are described in FIGS. 3-4. The first die 812 includes a first set of interconnects 822 (e.g., bumps, copper pillar). The second die 814 includes a second set of interconnects 824 (e.g., bumps, copper pillar). As shown at stage 2, the first set of interconnects 822 of the first die 812 is coupled to the first set of interconnects 802 of the carrier 800. Similarly, the second set of interconnects 824 of the second die 814 is coupled to the second set of interconnects 804 of the carrier 800. In some implementations, the first die 812 and/or the second die 814 are wafer level dies.

At stage 3, an underfill 830 is provided on the carrier 800. In some implementations, the underfill 830 is provided such that the underfill 830 covers the first set of interconnects 802, the second set of interconnects 804, the first set of interconnects 822, and the second set of interconnects 824. In some implementations, providing the underfill 830 is optional.

At stage 4, an encapsulation material 840 is provided. The encapsulation material 840 substantially or completely surrounds or encapsulates the first die 812 and the second die 814.

Figure 8B:
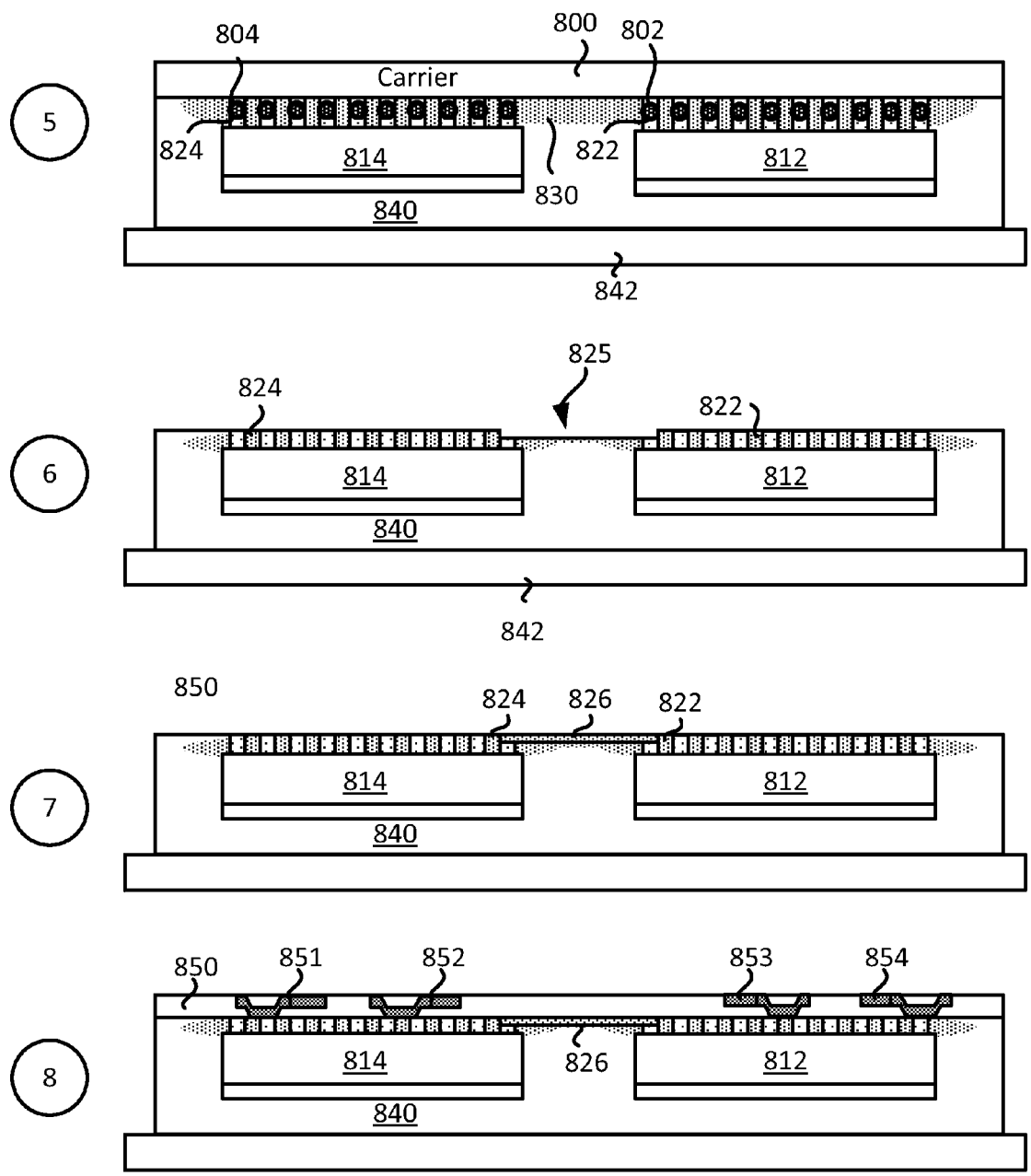
FIG. 8B illustrates part of an exemplary sequence for providing/manufacturing an integrated device.

At stage 5, as shown in FIG. 8B, the integrated device is flipped and coupled to a temporary carrier 842. That is, the encapsulation material 840 is coupled to the temporary carrier 842. Different implementations may use different materials (e.g., substrate, silicon, glass, ceramic) for the carrier

842. In some implementations, an adhesive layer (not shown) may be used to couple the encapsulation material 840 of the integrated device to the temporary carrier 842. Different implementations may use different materials for the adhesion layer. In some implementations, the temporary carrier 842 is a bonding tape.

At stage 6, a first surface of the integrated device is removed (e.g., polished, grinded). In this example, the surface that includes the carrier 800 is removed (e.g., polished, grinded). In some implementations, polishing the integrated device may include polishing and/or grinding the carrier 800, the first set of interconnects 802, the second set of interconnects 804, the first set of interconnects 812, the second set of interconnects 814, the underfill 830, and/or the encapsulation material 840. In some implementations, polishing the integrated device may leave behind portions of the first set of interconnects 802, the second set of interconnects 804, the first set of interconnects 812, the second set of interconnects 814, the underfill 830, and/or the encapsulation material 840.

In some implementations, polishing the integrated device includes creating at least one cavity (e.g., cavities 825) in the integrated device. For example, the cavity 825 may be created in the underfill 830 and/or the encapsulation material 840.

At stage 7, a metal layer is provided in the cavity 825. The metal layer defines an interconnect from a set of interconnects 826. When several cavities are created, several metal layers may be provided in some implementations. The set of interconnects 826 electrically couples the first set of interconnects 822 and the second set of interconnects 824. In some implementations, the set of interconnects 826 electrically couples the first die 812 and the second die 814. In some implementations, the set of interconnects 826 bypasses the use of unnecessary landing pads (e.g., big bump pads) when coupling to the first set of interconnects 822 and/or the second set of interconnects 824. In some implementations, the set of interconnects 826 is directly coupled to the first set of interconnects 822 and the second set of interconnects 824. In some implementations, the set of interconnects 826 is coupled to the side surface of the first set of interconnects 822 and the side surface of the second set of interconnects 824. In some implementations, the set of interconnects 826 is coupled to the top surface of the first set of interconnects 822 and the top surface of the second set of interconnects 824. In some implementations, the set of interconnects 826 are high density interconnects. In some implementations, a pitch of the set of interconnects 826 is about 40 microns (μm) or less.

At stage 8, a first dielectric layer 850 and several redistribution interconnects (e.g., redistribution interconnects 851-854) are provided on the front side of the first die 812 and the second die 814. Specifically, several interconnects are provided on the first set of interconnect 822 and the second set of interconnects 824. In some implementations, the redistribution interconnects 851-854 are formed on a first redistribution metal layer. In some implementations, the redistribution interconnects 855-854 may include at least one via. In some implementations, the redistribution interconnects 851-854 bypasses the use of unnecessary landing pads (e.g., big bump pads) when coupling to the first set of interconnect 822 and/or the second set of interconnects 824. In some implementations, the redistribution interconnects 851-854 are directly coupled to the first set of interconnects 822 and/or the second set of interconnects 824.

Figure 8C:
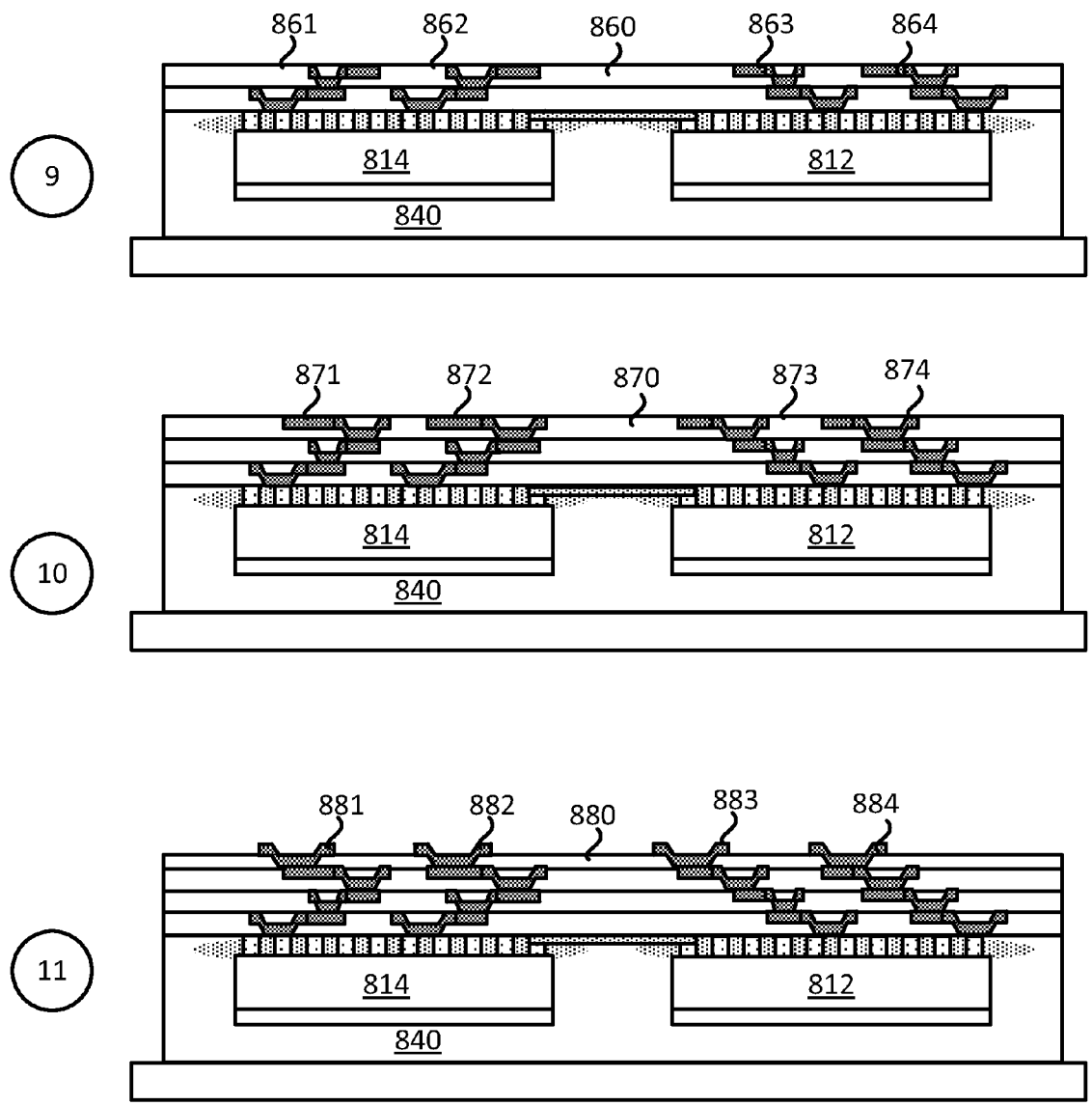
FIG. 8C illustrates part of an exemplary sequence for providing/manufacturing an integrated device.

At stage 9, as shown in FIG. 8C, a second dielectric layer 860 and several redistribution interconnects (e.g., redistribution interconnects 861-864) are provided on the first dielectric layer 850 and the redistribution interconnects 851-854. In some implementations, the redistribution interconnects 861-864 is formed on a second redistribution metal layer. In some implementations, the redistribution interconnects 861-864 may include at least one via.

At stage 10, a third dielectric layer 870 and several redistribution interconnects (e.g., redistribution interconnects 871-874) are provided on the second dielectric layer 860 and the redistribution interconnects 861-864. In some implementations, the redistribution interconnects 871-874 is formed on a third redistribution metal layer. In some implementations, the redistribution interconnects 871-874 may include at least one via.

At stage 11, at least one under bump metallization (UBM) layer is provided. Specifically, a first under bump metallization (UBM) layer 881, a second UBM layer 882, a third UBM layer 883, and a fourth UBM layer 884 are provided. The UBM layers are provided on the fourth dielectric layer 880. In some implementations, providing the UBM layer is optional.

Figure 8D:
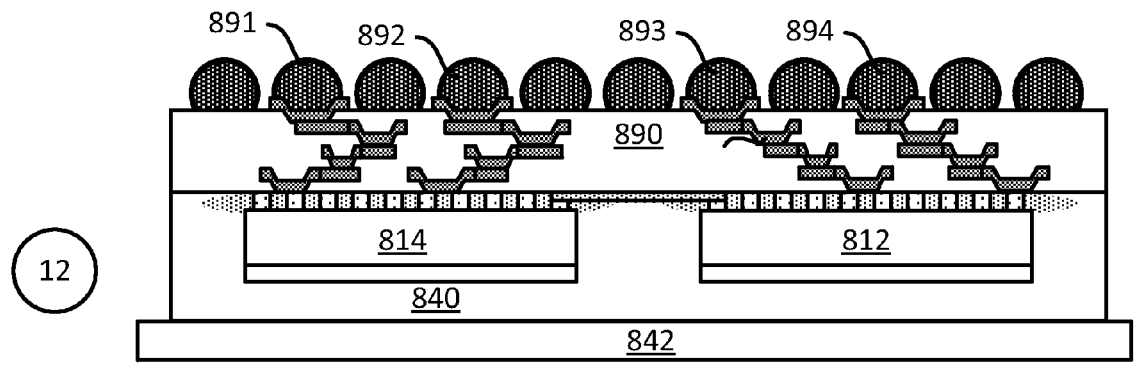
FIG. 8D illustrates part of an exemplary sequence for providing/manufacturing an integrated device.
Figure 8D:
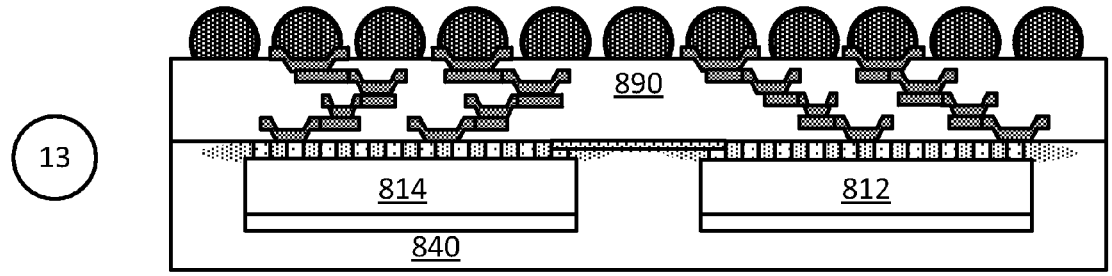

At stage 12, as shown in FIG. 8D, at least one solder ball is provided on the UBM layer. Specifically, a first solder ball 891 is coupled to the first UBM layer 881, a second solder ball 892 is coupled to the second UBM layer 882, a third solder ball 893 is coupled to the third UBM layer 883, and a fourth solder ball 894 is coupled to the fourth UBM layer 884. Stage 12 illustrates the set of dielectric layers 890. In some implementations, the set of dielectric layers 890 includes the dielectric layers 850, 860, 870 and 880. In some implementations, the solder ball may be coupled to the redistribution interconnects instead of the UBM layer.

At stage 13, a portion of the integrated device is removed (e.g., polished). As shown at stage 12, at least a portion of the carrier 842 is removed (e.g., entire carrier 842 is removed). In some implementations, at least a portion of the encapsulation material 840 is also removed.

Having described a sequence for providing/manufacturing an integrated device (e.g., semiconductor device), a method for providing/manufacturing an integrated device (e.g., semiconductor device) will now be described below.

Exemplary Method for Providing/Manufacturing an Integrated Device

Figure 9:
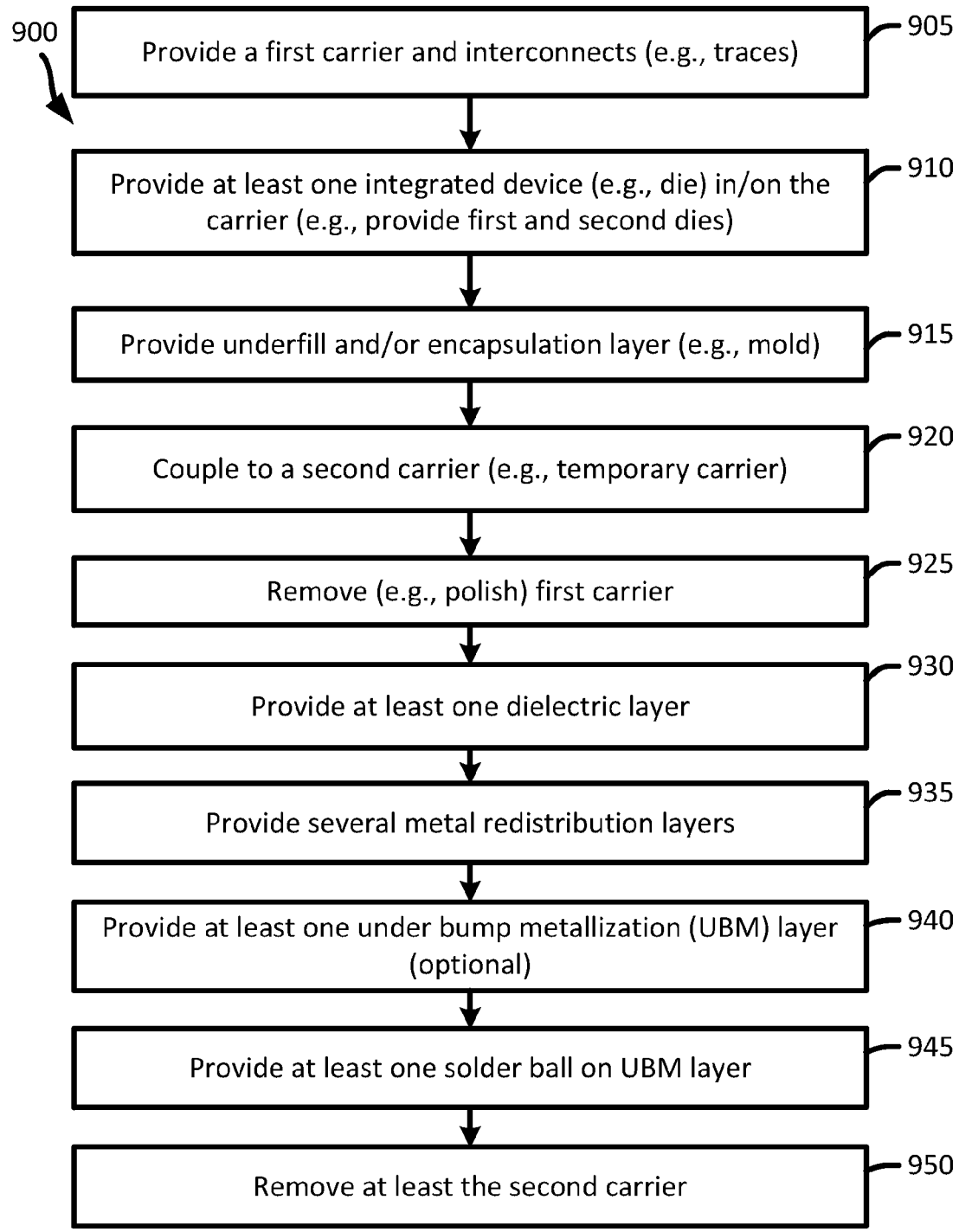
FIG. 9 illustrates an exemplary method for providing/manufacturing an integrated device.

FIG. 9 illustrates an exemplary method for providing an integrated device (e.g., integrated package). In some implementations, the method of FIG. 9 may be used to provide/manufacture the integrated device of FIGS. 2 and/or 5-6, and/or other integrated devices (e.g., die package) described in the present disclose.

The method provides (at 805) a first carrier (e.g., carrier 800) and interconnects (e.g., traces). In some implementations, the first carrier is a sacrificial carrier. In some implementations, the first carrier is a substrate. Different implementations may use different materials for the first carrier (e.g., silicon substrate, glass substrate, ceramic substrate).

The method then provides (at 910) at least one integrated device (e.g., die) on the carrier. In some implementations, providing (at 810) at least one integrated device includes providing a first die on the first carrier and providing a second die on the first carrier. In some implementations, the dies that are provided are wafer level dies. Examples of providing at least one die is shown in FIG. 8A (see e.g., stage 2).

The method optionally provides (at 815) an underfill and an encapsulation material. In some implementations, the underfill is provided between the dies and the first carrier. In some implementations, the interconnects 802, 804, 822, and 824 are covered by the underfill. In some implementations, the encapsulation material substantially or completely surrounds or encapsulates the dies (e.g., first die 812, the second die 814).

The method couples (at 920) the integrated device that includes the first carrier and the first and second dies, to a second carrier. In some implementations, the second carrier is a temporary carrier. Different implementations may use different materials for the second carrier. In some implementations, the second carrier is a bonding tape.

The method further removes (at 925) at least a portion of the integrated device. In some implementations, removing at least a portion of the integrated device includes removing (e.g., polishing, grinding) at least the first carrier, portions of the underfill, portions of the encapsulation layer, and/or the interconnects (e.g., interconnects 802, 804, 822, 824). In some implementations, after removing a portion of the integrated device, at least one metal layer may be provided in a cavity. In some implementations, the metal layer in the cavity may define an interconnect (e.g., high density interconnect between two dies).

The method further provides (at 930) at least one dielectric layer (e.g., dielectric layers 850, 860, 870, 880). Different implementations may use different materials for the dielectric layers. For example, first and second insulation layers (which are a form of a dielectric layer) may be a Polybenzoxazole (PbO) layer and/or a polymer layer.

The method also provides (at 935) several metal redistribution layers. In some implementations, providing several redistribution layers includes providing several redistribution interconnects (e.g., redistribution interconnects 851-854) and/or vias. It should be noted that in some implementations, the method of providing (at 930) at least one dielectric layer, and providing (at 935) the metal redistribution layers may be performed sequentially back and forth. That is, in some implementations, the method may provide a first dielectric layer, a first redistribution layer, a second dielectric layer, a second redistribution layer, and so on and so forth.

The method then optionally provides (at 940) an under bump metallization (UBM) layer. In some implementations, providing (at 940) the UBM layer includes coupling the UBM layer to a metal redistribution layer. In some implementations, the UBM layer is a copper layer. The method further provides (at 945) a solder ball on the UBM layer.

The method further removes (at 950) at least a portion of the integrated device. In some implementations, removing a portion of the integrated device includes removing (e.g., polishing, grinding) at least a portion of the carrier 842. In some implementations, at least a portion of the encapsulation material 840 is also removed.

Exemplary Sequence for Providing/Manufacturing Redistribution Layers

Figure 10A:
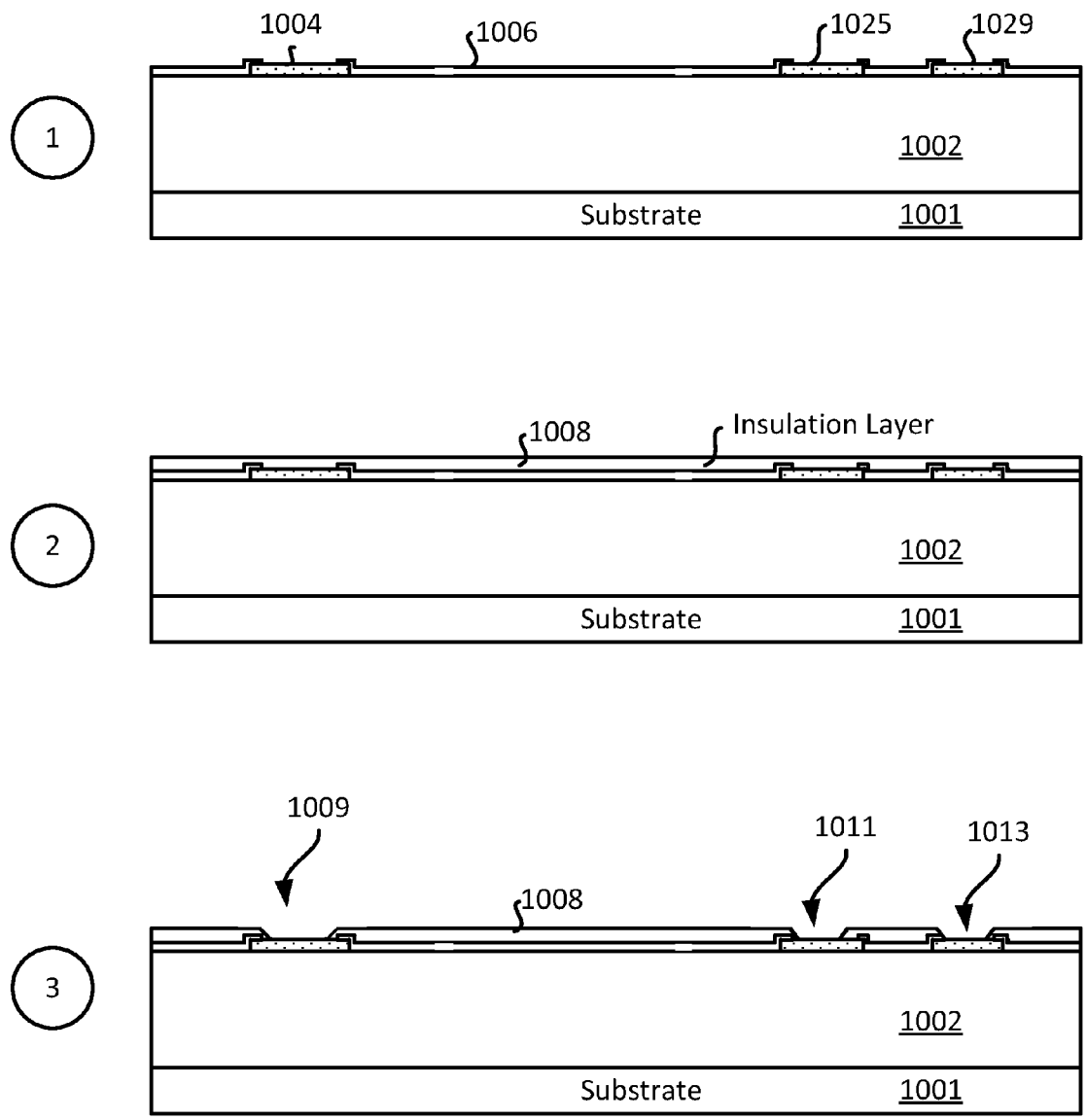
FIG. 10A illustrates part of an exemplary sequence for providing/manufacturing an integrated device.
Figure 10B:
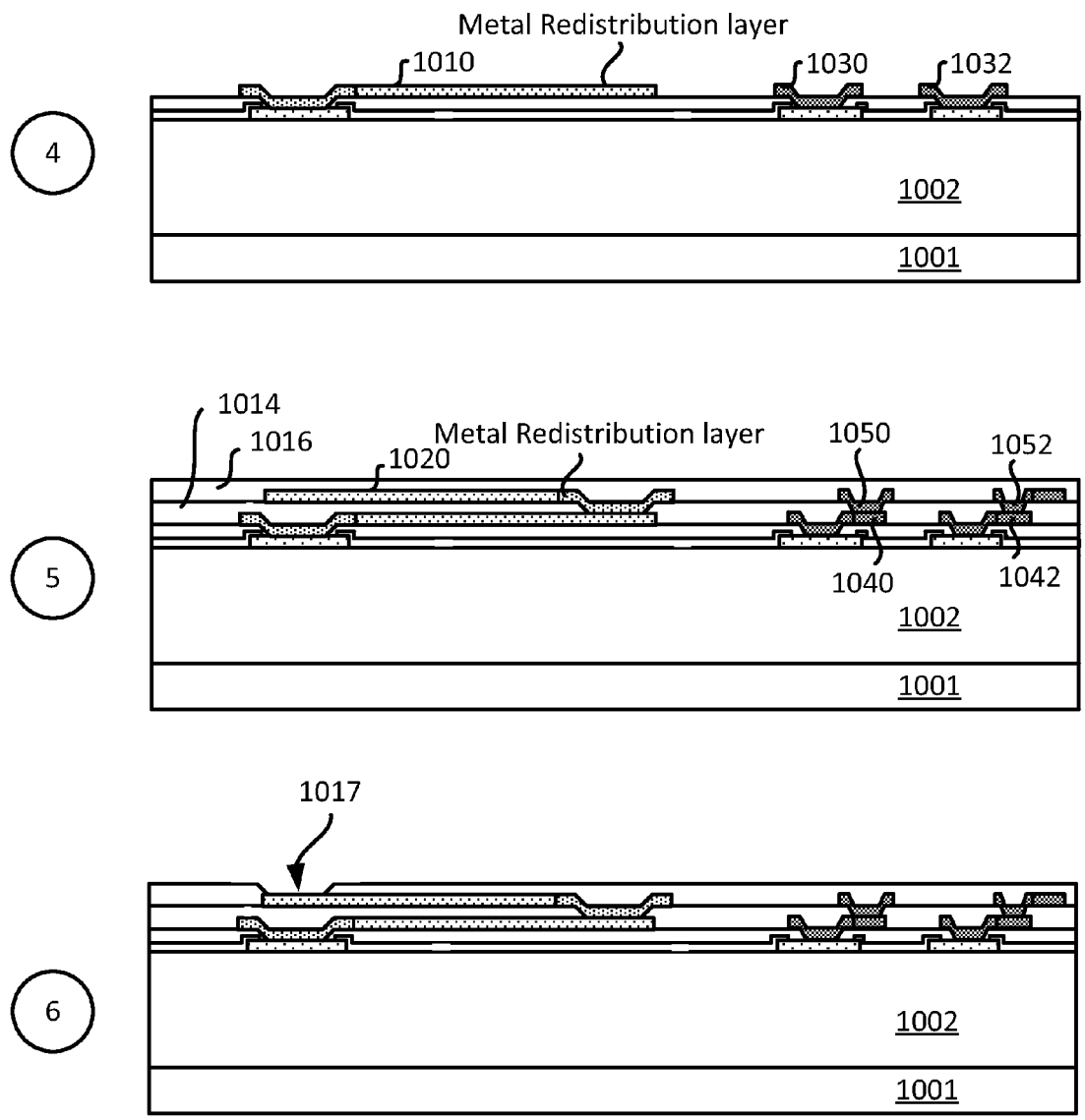
FIG. 10B illustrates part of an exemplary sequence for providing/manufacturing an integrated device.
Figure 10C:
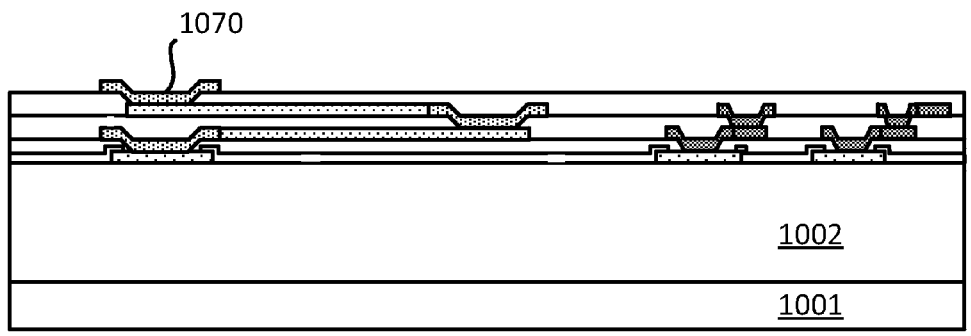
FIG. 10C illustrates part of an exemplary sequence for providing/manufacturing an integrated device.
Figure 10C:
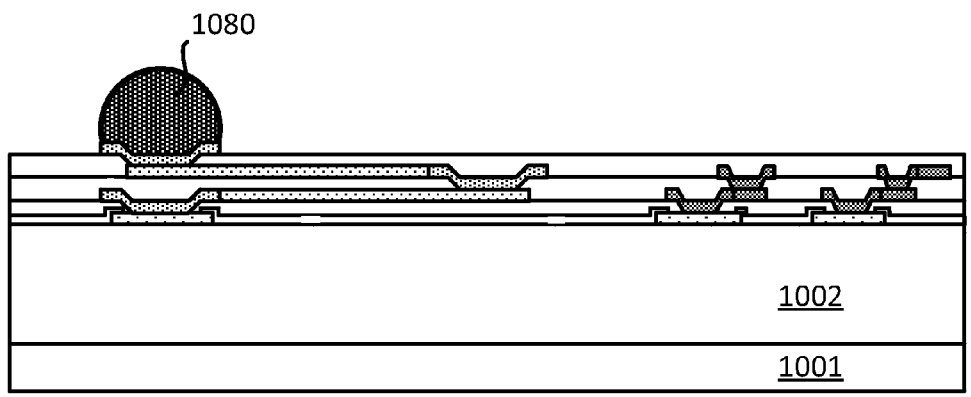

In some implementations, providing an integrated device that includes redistribution layers includes several processes. FIGS. 10A-10C illustrate an exemplary sequence for providing an integrated device that includes several redistribution layers. In some implementations, the sequence of FIGS. 10A-10C may be used to provide/manufacture the integrated device of FIGS. 2 and/or 5-6, and/or other integrated devices (e.g., dies) described in the present disclose. It should also be noted that the sequence of FIGS. 10A-10C may be used to provide/manufacture integrated devices that also include circuit elements. It should further be noted that the sequence of FIGS. 10A-10C may combine one or more stages in order to simplify and/or clarify the sequence for providing an integrated device that includes redistribution layers. FIGS. 10A-10C a more specific process for providing one or more redistribution layers.

As shown in stage 1 of FIG. 10A, a substrate (e.g., substrate 1001) is provided. In some implementations, the substrate 1001 is a wafer. Different implementations may use different materials for the substrate (e.g., silicon substrate, glass substrate, ceramic substrate).

In addition, at stage 1, several lower level metal layers and dielectric layers (e.g., lower level metal and dielectric layers 1002) are provided on the substrate 1001. Different implementations may provide different number of lower level metal layers and dielectric layers (e.g., M1 metal layer, M2 metal layer, M3 metal layer, M4 metal layer, M5 metal layer, M6 metal layer, M7 metal layer).

In some implementations, circuits, routes and/or interconnects are also provided. However, for the purpose of simplification and clarity, circuits, routes and/or interconnects are not shown in the lower level metal layers and dielectric layers 1002.

Moreover, at stage 1, at least one pad (e.g., pads 1004, 1025, 1029) is provided on the lower level metal layers and dielectric layers 1002. In some implementations, the pad 1004 is coupled to one of the lower level metal layer (e.g., the top lower level metal layer, M7 metal layer). In some implementations, the pad 1004 is an aluminum pad. However, different implementations may use different materials for the pad 1004. Different implementations may use different processes for providing the pad on the lower level metal layers and dielectric layers 1002. For example, in some implementations, a lithography and/or etching process may be use to provide the pad 1004 on the lower level metal layers and dielectric layers 1002.

Additionally, at stage 1, a passivation layer (e.g., passivation layer 1006) is provided on the lower level metal layers and dielectric layers 1002. Different implementations may use different materials for the passivation layer 1006. As shown in stage 4, the passivation layer 1006 is provided on the lower level metal layers and dielectric layers 1002 such that at least a portion of the pad 1004 is exposed.

At stage 2, a first insulation layer (e.g., first insulation layer 1008) is provided on the passivation layer 1006 and the pads 1004, 1025 and 1029. In some implementations, the first insulation layer 1008 is a dielectric layer. Different implementations may use different materials for the first insulation layer 1008. For example, the first insulation layer 1008 may be a Polybenzoxazole (PbO) layer or a polymer layer.

At stage 3, several cavities (e.g., cavity, trench) is provided/created in the first insulation layer 1008. As further shown in stage 3, the cavity 1009 is created over the pad 1004. Similarly, a cavity 1011 is created over the pad 1025, and a cavity 1013 is created over the pad 1029. Different implementations may create the cavities (e.g., cavity 1009) differently. For example, the cavity 1009 may be provided/created by etching the first insulation layer 1008.

At stage 4 of FIG. 10B, a first metal redistribution layer is provided. Specifically, a first metal redistribution layer 1010 is provided over the pad 1004 and the first insulation layer 1008. As shown in stage 4, the first metal redistribution layer 1010 is coupled to the pad 1004. The first metal redistribution layer 1010 also includes a first metal layer 1030 and a second metal layer 1032. That is, in some implementations, the first metal layer 1030 and the second metal layer 1032 is on the same layer as the first metal redistribution layer 1010. In some implementations, the first and second metal layers 1020 and 1030 are vias. In some implementations, the first metal redistribution layer 1010 is a copper layer.

At stage 5, several insulation layers and several redistribution layers are provided. Specifically, a second insulation layer 1014 and a third insulation layer 1016 are provided. Moreover, a second metal redistribution layer 1020 is provided. In addition, several metal layers (1040, 1050, 1042,

1052) are provided. In some implementations, the metal layers are part of the redistribution layers. In some implementations, some of the metal layers include vias. For example, metal layers 1042, and 1052 are vias and metal layers 1040 and 1050, are traces in some implementations.

At stage 6, a cavity 1017 is provided in the insulation layer 1016. The cavity 1017 in the insulation layer 1016 is over a portion of the interconnect 1020.

At stage 7 of FIG. 10C, an under bump metallization (UBM) layer is provided. Specifically, an under bump metallization (UBM) layer 1070 is provided in the cavity 1017 of the insulation layer 1016. In some implementations, the UBM layer 1070 is a copper layer.

At stage 8, a solder ball is provided on the UBM layer. Specifically, a solder ball 1080 is coupled to the UBM layer 1070.

Exemplary Electronic Devices

Figure 11:
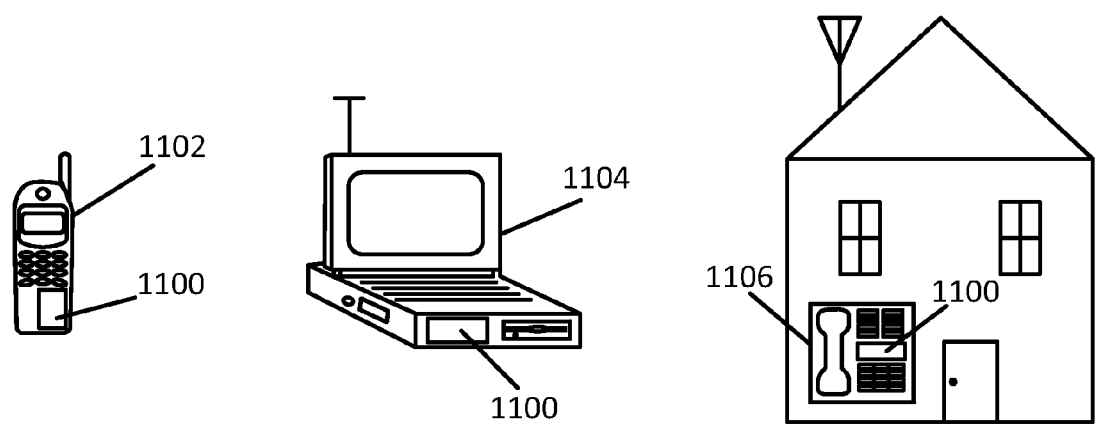
FIG. 11 illustrates various electronic devices that may integrate a semiconductor device, a die, an integrated circuit and/or PCB described herein.

FIG. 11 illustrates various electronic devices that may be integrated with any of the aforementioned semiconductor device, integrated circuit, die, interposer or package. For example, a mobile telephone 1102, a laptop computer 1104, and a fixed location terminal 1106 may include an integrated circuit (IC) 1100 as described herein. The IC 1100 may be, for example, any of the integrated circuits, dice or packages described herein. The devices 1102, 1104, 1106 illustrated in FIG. 11 are merely exemplary. Other electronic devices may also feature the IC 1100 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7A-7D, 8A-8D, 9, 10A-10C and/or 11 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7A-7D, 8A-8D, 9, 10A-10C and/or 11 and its corresponding description in the present disclosure is not limited to dies and/or ICs. In some implementations, 2, 3, 4, 5, 6, 7A-7D, 8A-8D, 9, 10A-10C and/or 11 and its corresponding description may be used to manufacture, create, provide, and/or produce integrated devices. In some an integrated device may include a die package, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a base portion for the integrated device, the base portion comprising:
   a dielectric layer; and
   a set of redistribution metal layers;
   a first die coupled to a first surface of the base portion, the first die comprising a first set of interconnects;
   a second die coupled to the first surface of the base portion, the second die comprising a second set of interconnects;
   a third set of interconnects on the base portion, the third set of interconnects coupled directly to the first set of interconnects and coupled directly to the second set of interconnects while omitting a landing pad; and
   an underfill between the first die and the base portion.

2. The integrated device of claim 1, further comprising an encapsulation material that encapsulates the first die.

3. The integrated device of claim 1, wherein the third set of interconnects comprises a first pitch that is about 40 microns (μm) or less.

4. The integrated device of claim 1, wherein the first die is a first wafer level die.

5. The integrated device of claim 1, wherein the first die being coupled to the set of redistribution metal layers through the first set of interconnects.

6. The integrated device of claim 5, wherein the first set of interconnects comprises a first pitch that is about 40 microns (μm) or less.

7. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

8. An apparatus comprising:
   a base portion for an integrated device, the base portion comprising:
   a dielectric layer; and
   a redistribution means;
   a first die coupled to a first surface of the base portion, the first die comprising a first set of interconnects;
   a second die coupled to the first surface of the base portion, the second die comprising a second set of interconnects;
   a third set of interconnects on the base portion, the third set of interconnects coupled directly to the first set of interconnects and coupled directly to the second set of interconnects while omitting a landing pad; and
   a means for encapsulating an area between the first die and the base portion.

9. The apparatus of claim 8, further comprising an encapsulation means that encapsulates the first die.

10. The apparatus of claim 8, wherein the third set of interconnects comprises a first pitch that is about 40 microns (μm) or less.

11. The apparatus of claim 8, wherein the first die is a first wafer level die.

12. The apparatus of claim 8, wherein the first die being coupled to the redistribution means through the first set of interconnects.

13. The apparatus of claim 12, wherein the first set of interconnects comprises a first pitch that is about 40 microns (μm) or less.

14. The apparatus of claim 8, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

15. A method for providing an integrated device, comprising:
 forming a base portion for the integrated device, wherein forming the base portion comprises:
 forming a dielectric layer; and
 forming a set of redistribution metal layers;
 providing a first die on a first surface of the base portion and providing a first set of interconnects;
 providing a second die on the first surface of the base portion and providing a second set of interconnects;
 forming a third set of interconnects on the base portion, the third set of interconnects coupled directly to the first set of interconnects and coupled directly to the second set of interconnects while omitting a landing pad; and
 forming an underfill between the first die and the base portion.

16. The method of claim 15, further comprising forming an encapsulation material that encapsulates the first die.

17. The method of claim 15, wherein the third set of interconnects comprises a first pitch that is about 40 microns (μm) or less.

18. The method of claim 15, wherein the first die is a first wafer level die.

19. The method of claim 15, wherein the first die being coupled to the set of redistribution metal layers through the first set of interconnects.

20. The method of claim 19, wherein the first set of interconnects comprises a first pitch that is about 40 microns (μm) or less.

21. The method of claim 15, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

22. The integrated device of claim 1, wherein the first, second and third set of interconnects comprise a same metal.

23. The apparatus of claim 8, wherein the first, second and third set of interconnects comprise a same metal.

24. The method of claim 15, wherein the first, second and third set of interconnects comprise a same metal.

* * * * *